US006981195B2

(12) United States Patent
Newcombe et al.

(10) Patent No.: US 6,981,195 B2
(45) Date of Patent: Dec. 27, 2005

(54) CYCLIC REDUNDANCY CHECK WITH EFFICIENT RE-COMPUTATION OF ERROR DETECTION CODE

(75) Inventors: Dalton J. Newcombe, Toronto (CA); Tilaye Terrefe, Toronto (CA)

(73) Assignee: Analog Devices, Inc., Norwood, MA (US)

( * ) Notice: Subject to any disclaimer, the term of this patent is extended or adjusted under 35 U.S.C. 154(b) by 392 days.

(21) Appl. No.: 10/211,617

(22) Filed: Aug. 2, 2002

(65) Prior Publication Data

US 2004/0230885 A1   Nov. 18, 2004

(51) Int. Cl.[7] ............................................. H03M 13/03
(52) U.S. Cl. ..................................................... 714/758
(58) Field of Search ............................... 714/752, 758, 714/801, 807, 776

(56) References Cited

U.S. PATENT DOCUMENTS

| | | | | |
|---|---|---|---|---|
| 5,046,069 A | | 9/1991 | Calvignac et al. | 714/807 |
| 5,131,012 A | | 7/1992 | Dravida | 375/108 |
| 6,014,767 A | | 1/2000 | Glaise | 714/776 |
| 6,023,455 A | | 2/2000 | Takahashi | 370/249 |
| 6,128,766 A | * | 10/2000 | Fahmi et al. | 714/807 |

FOREIGN PATENT DOCUMENTS

| | | | | |
|---|---|---|---|---|
| EP | 0681381 A | 11/1995 | | H04L 1/00 |

OTHER PUBLICATIONS

Roginsky et al., Efficient computation of packet CRC from partial CRCs with application to the Cells-in-frames protocol, 1998, ELSEVIER Computer Communications 21, p. 654-651.*

Gutman M: "A Method for Updating a Cyclic Redundancy Code", IEEE Transactions on Communications, IEEE Inc. New York, US, vol. 40, No. 6, Jun. 1, 1992, pp. 989-991, XP000291536, ISSN: 0090-6778, the whole document.

"Embedded Check Generation for Label Swapping", IBM Technical Disclosure Bulletin, IBM Corp. New York, US, vol. 34, No. 10A, Mar. 1, 1992, pp. 34-38, XP000302213, ISSN: 0018-8689, the whole document.

* cited by examiner

*Primary Examiner*—Shelly Chase
(74) *Attorney, Agent, or Firm*—Koppel, Jacobs, Patrick & Heybl (57) ABSTRACT

Efficient re-computation of an error detection code is achieved with an original data message that includes a payload and an error detection code. The error detection code comprises a value determined according to an error detection formula using the payload. The payload is modified using a payload transformation formula. The error detection code is re-computed from the original error detection code, rather than from the modified payload. The formula for re-computing the error detection code is different from the formula used to originally obtain the error detection formula, and does not use the original payload or the modified payload.

48 Claims, 4 Drawing Sheets

CYCLIC REDUNDANCY CHECK WITH EFFICIENT RE-COMPUTATION OF ERROR DETECTION CODE

BACKGROUND OF THE INVENTION

1. Field of the Invention

The present invention relates to error detection in data communication.

2. Description of the Related Art

An error detection code is a value indicative of a change in a data field. The cyclic redundancy check (CRC) is an error-detection method based on a transformation of the bit pattern in a data message (e.g., a packet, frame or cell). The basic idea of CRC algorithms is simply to treat the message as a binary number, to divide it by another fixed binary number, and to append the remainder from this division onto the end of the message. The remainder is the error detection code. The quotient is not used in CRC error detection. The divisor is a polynomial whose order depends on the number of bits allocated for the remainder, and is typically referred to as the generating polynomial.

CRC calculations can be computationally intensive, especially with longer messages. In situations where the message length is fixed and where high speed is desired, CRCs are often computed using look-up tables. Look-up tables are used in these situations to ease the computations at the expense of more memory.

Use of CRC in error detection has six basic steps. First, the sender computes a CRC value. Second, the send appends this CRC value to the data message. Third, the sender sends the error-encoded data message. Fourth, the receiver receives the error-encoded message. Fifth, the receiver computes a CRC value based on the data portion of the received packet. Sixth, the receiver compares his CRC value with the sender's CRC value in the error-encoded message. If the two match, there is a high probability that the message has been received without error. The probability is high enough that undetected errors must involve more than two bits in the message, and will generally be recognized through other means. It should be noted that as an alternative to the fifth step, a binary checksum may be computed on the entire error-encoded data.

CRCs are commonly used for error correction in asynchronous transfer mode (ATM) networks. ATM networks are packet-switched, and the applicable specifications provide several cell types. ATM cells are 53 bytes, consisting of a 5 byte header and 48 bytes of information. In addition to ATM networks, CRCs are commonly used for error correction in other networks. For example, forms of CRC-16 are used in X.25, SDLC/HDLC and XMODEM communications. Forms of CRC-32 are used in Ethernet networks, PKZIP compression and FDDI networks.

ATM networks include system management functions to achieve efficient internal operation. Included within system management are a number of functions grouped together as "operations and maintenance" (OAM). OAM includes fault management, performance management, configuration management, accounting management, security management and traffic management. These functions generally operate independently and according to defined procedures. OAM cells can be generated, inserted, processed, monitored, routed and terminated at various points in an ATM network.

Figure 1A:
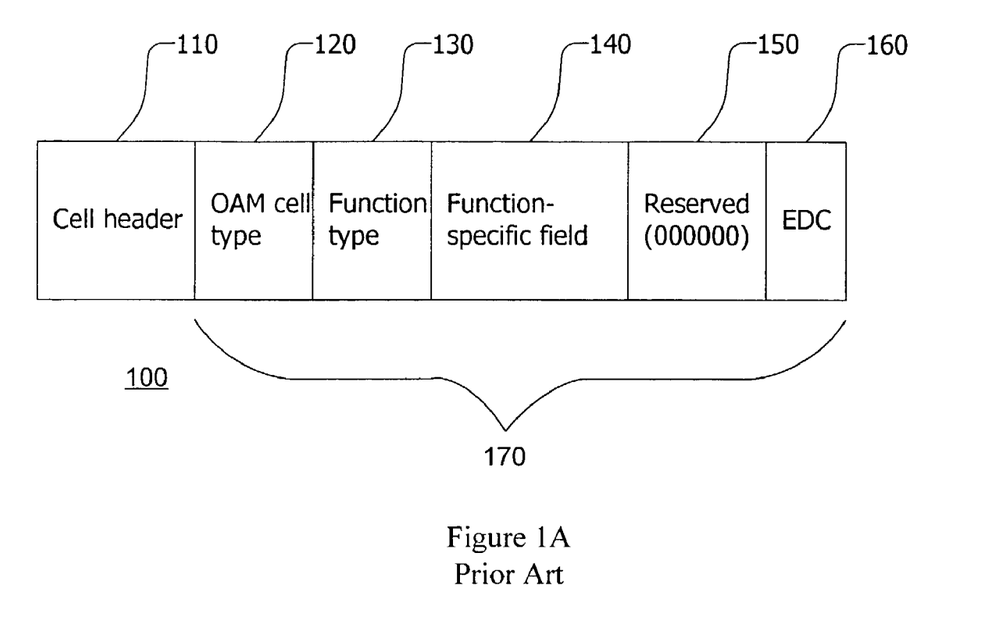
FIG. 1A is a diagram of an OAM cell in accordance with the prior art.

One type of ATM cell is the OAM cell. FIG. 1A shows the format of an OAM cell 100. The OAM cell 100 includes a 5-byte header 110 (like all ATM cells) and 48 bytes of payload 170 consisting of a 4-bit OAM cell type 120, a 4-bit function type 130, a 45-byte function specific field 140, a 6-bit reserved space 150 and a 10-bit error detection code (EDC) field 160. OAM fault management cells are used for alarm surveillance, continuity checks and loopback testing.

Error detection codes such as that in the EDC field 160 help in detection of whether the payload has been corrupted during transmission of the respective data message. The EDC field 160 is a CRC-10 error detection code using the generating polynomial $X^{10}+x^9+x^5+x^4+x+1$ (i.e., the modulo-2 divisor 11000110011). The CRC-10 is computed from the payload 170 (except for the EDC field 160). Ordinarily, to compute a CRC-10 of the 48-byte payload, a processor will need a 256 byte look-up table (stored in RAM) and about 48×N instructions or operations, where N is the number of instructions (approximately 12 for an Intel 8051 micro-controller) or operations needed to compute the CRC-10 on one byte. It can be seen that CRC computation can be a significant load, especially in embedded systems that employ slow microprocessors.

ATM communications are carried along virtual channels (VCs). Where greater bandwidth is needed for a given communication session than is available in a single VC, several VCs may be bundled into a virtual path (VP) The end-to-end arrangement of a VC or VP is called a connection, meaning that ATM communications are actually carried on virtual channel connections (VCCs) or virtual path connections (VPCs).

ATM operations and management provides many ways to test and control VCCs and VPCs. Loopback is a fault management function for testing the integrity of the connections within a VCC or VPC. The loopback function is useful for locating faults in a VCC or VPC. Loopback can also be used to measure round-trip cell transfer delays. In the loopback test, an OAM cell is inserted at some point into a VCC or VPC. When the cell reaches the endpoint of the VCC or VPC, the endpoint loops the OAM cell back (i.e., is returned in the reverse flow of the VC or VP).

Figure 1B:
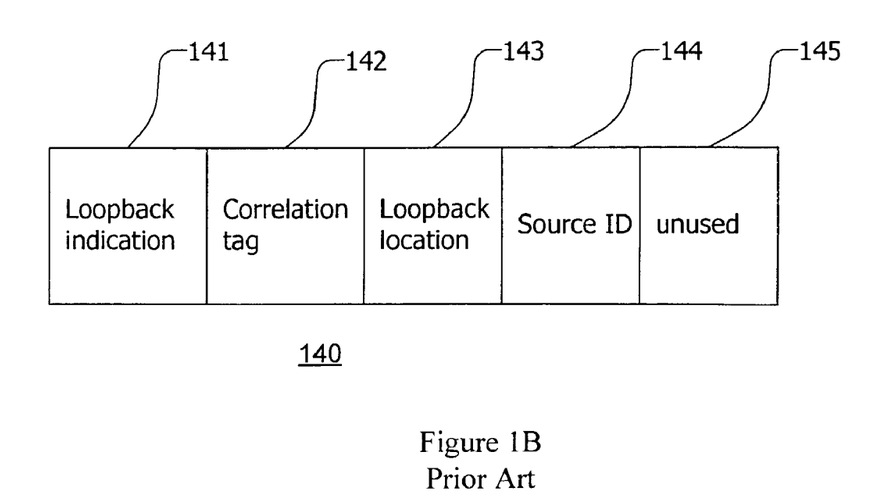
FIG. 1B is a diagram of the function-specific field of an OAM loopback cell in accordance with the prior art.

The layout of a loopback cell is specified. The cell type 120 is 0001, indicating an OAM cell. The function type 130 of a loopback cell is 1000. FIG. 1B shows the format of the function specific field 140. The function specific field 140 includes a 1-byte loopback indication field 141, a 4-byte correlation tap 142, a 15-byte loopback location field 143, a 15-byte source ID field 144, and 10-bytes of unused space 145. The loopback indication field 141 signifies whether loopback has occurred. The least significant bit of the loopback indication field 141 ("the loopback indication bit") is initially set to 1. Upon loopback, the loopback indication bit is reset to 0, indicating that the cell has been looped back. The correlation tag 142 identifies (correlates) related OAM cells within the same connection and uniquely identifies the cell. The loopback location field 143 is an optional field that identifies the point for loopback. The source ID field 144 is an optional field that allows the originator to identify its own cells.

ATM specification have been improved to permit higher speeds and greater bandwidths. Although processing efficiency has always been important to peak ATM operations, higher speeds and greater bandwidths place ever greater demands on cell processing.

BRIEF DESCRIPTION OF THE DRAWINGS

The present invention will be described by way of exemplary embodiments, but not limitations, illustrated in the accompanying drawings in which like references denote similar elements.

DETAILED DESCRIPTION OF THE INVENTION

Throughout this description, the embodiments and examples shown should be considered as exemplars, rather than limitations on the apparatus and methods of the present invention.

The System of the Invention

Figure 2:
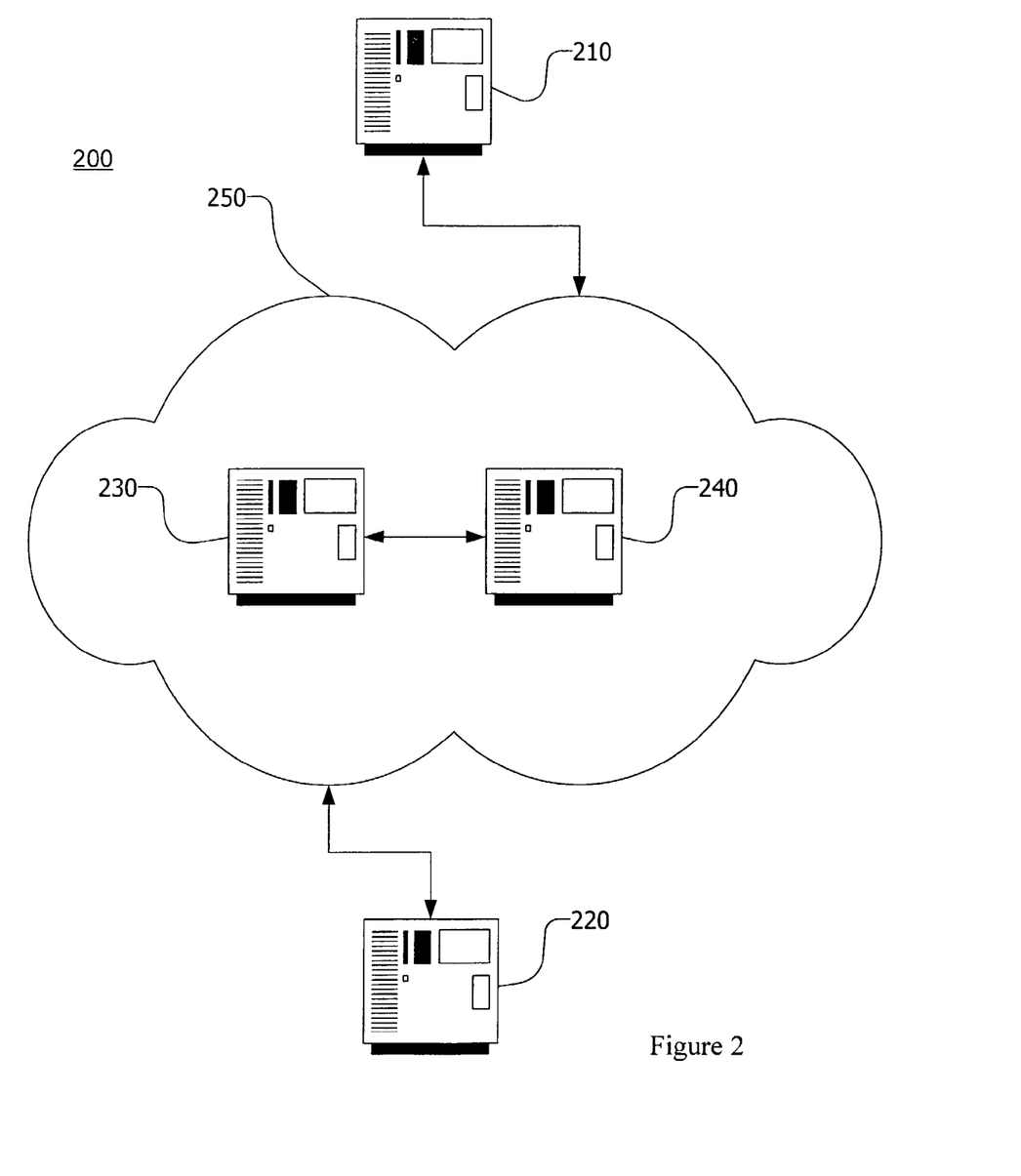
FIG. 2 is a diagram of a network in accordance with the invention.

Referring now to FIG. 2, there is shown a diagram of a network 200 in accordance with the invention. The network includes a first end point 210, a second end point 220, and a cloud 250. The first end point 210 will be referred to as the "originating end point". The second end point 220 will be referred to as the "loop back end point". Within the cloud 250 there may be any number of devices, including processors 230, 240.

The topology of network 200 is fairly generic and is compatible with most networking protocols and standards. The end points 210, 220 as well as the processors 230, 240 may be combinations of hardware and software, and may be, for example, routers, bridges, switches, hubs, computers or other types of devices which can connect to and function with a network. The network 200 may utilize protocols such as ATM and Ethernet, and may use combinations or layers of protocols.

Figure 3:
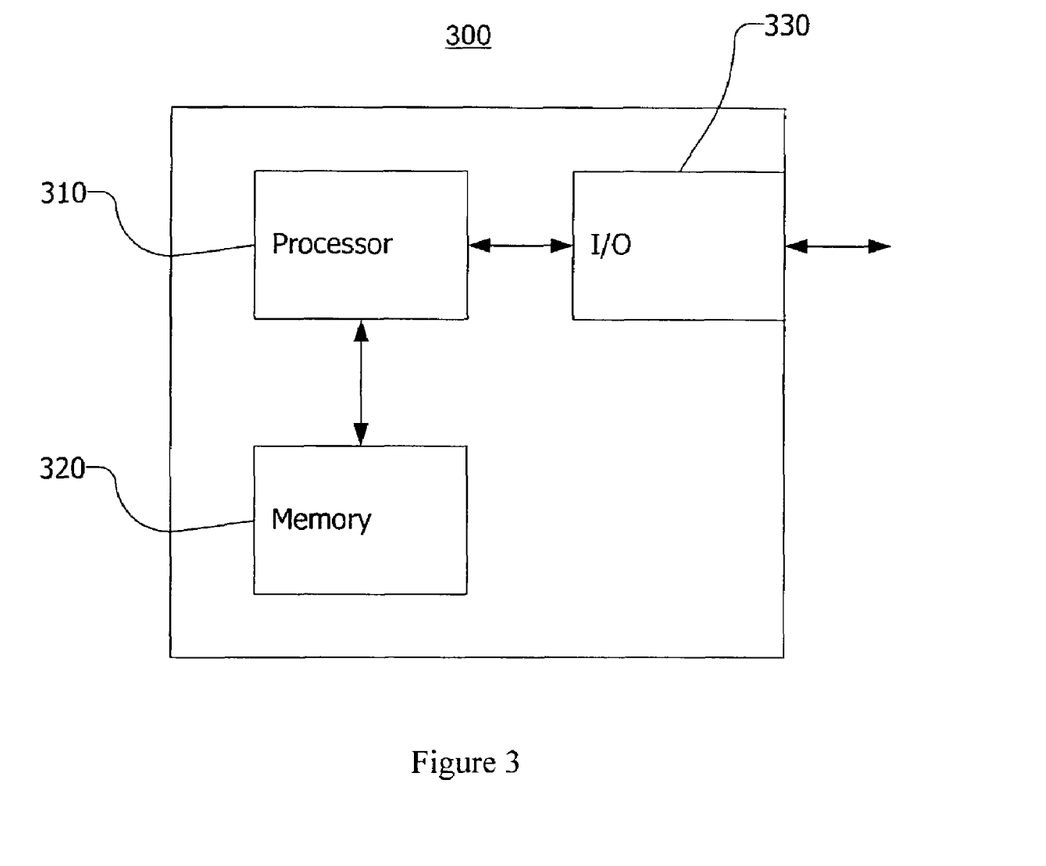
FIG. 3 is a block diagram of a device in accordance with the invention.

Referring now to FIG. 3, there is shown a device 300 in accordance with the invention. The device 300 comprises a processor 310, a memory 320 and I/O interface 330. The device 300 may be an integrated semiconductor chip, or may be a device such as a bridge or computer which incorporates one or more semiconductor chips having the processor 310, memory 320 and I/O interface 330. The device 300 may be, for example, a microcontroller, a digital signal processor or an ASIC. The memory 320 may be integrated with or in the processor 310, and may be volatile or nonvolatile.

The Methods of the Invention

Figure 4:
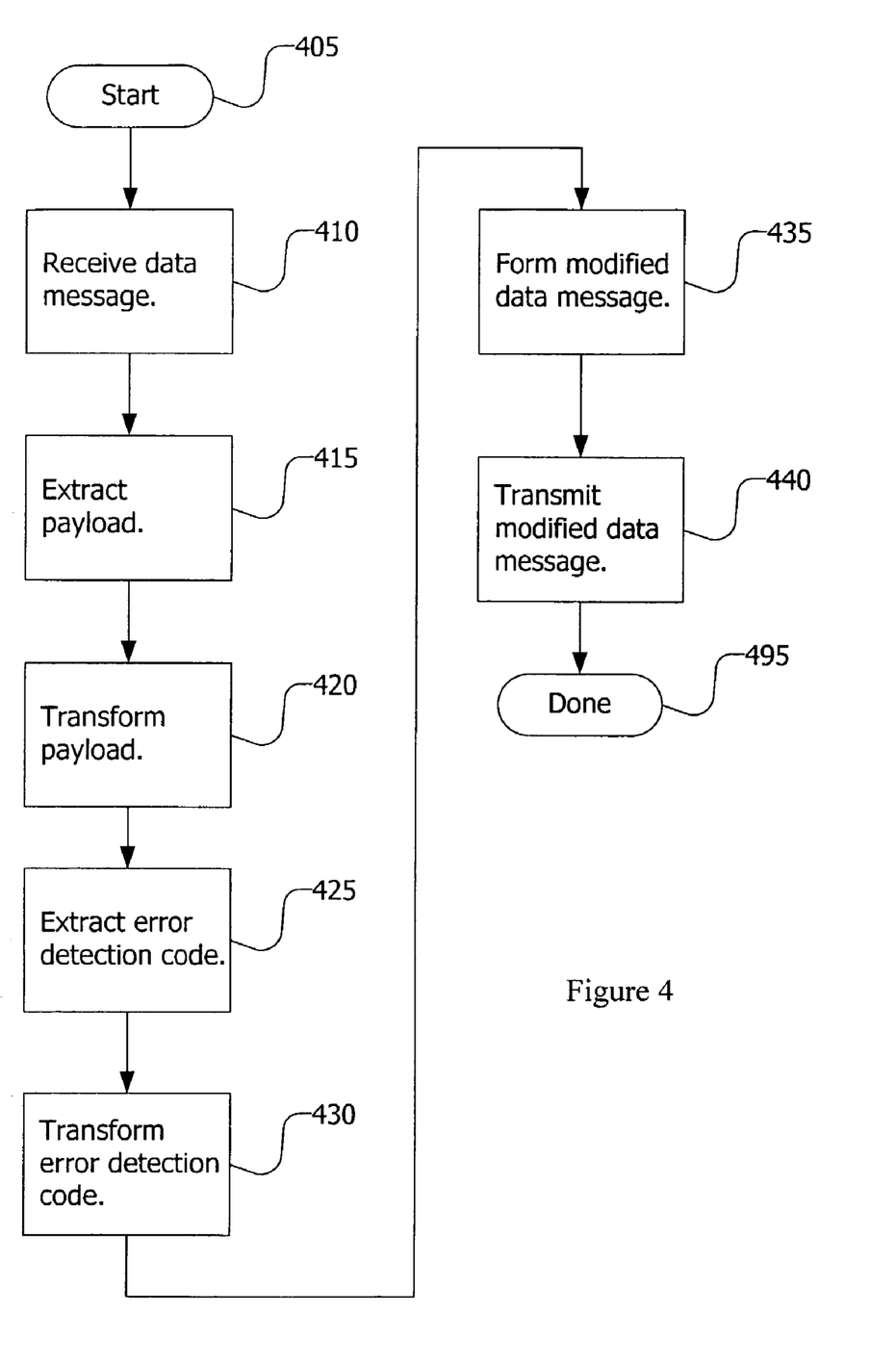
FIG. 4 is a flow chart of a method of efficient re-computation of error detection code in accordance with the invention.

Referring now to FIG. 4, there is shown a flow-chart of a method of efficient re-computation of an error detection code in a data message. The method may be practiced using the device 300 in the network 200. The data message with the original computation of the error detection code will be referred to as the "original data message", to differentiate it from its post-modification form. The modified form of the data message will be referred to as the "modified data message". The payload and error detecting code components of the data message will be referred to in the same manner.

Creating the original data message includes three steps. First, the original payload is created at the originating end point 210. Second, the original error detection code is obtained. The original error detection code has a value determined according to an error detection formula using the original payload. In mathematical terms, it can be said that the original error detection code is determined according to the equation $C_o=F_1(G, P_o)$, where $C_o$ is the original error detection code, $F_1(\ )$ is the error detection formula, $P_o$ is the original payload and G is the generator polynomial. $F_1$ is the remainder of dividing the original message polynomial $P_o$ by the generator polynomial G. In the case of an ATM OAM cell, the error detection formula is a CRC-10. The error detection formula may alternatively be another type of cyclic redundancy check, or another error detection formula such as a spreading checksum. The invention is well-suited to error detection schemes such as CRC where a remainder is used for error detection. The original error detection code may be obtained by computing the formula using the original payload, or from a table of payload values and corresponding pre-computed error detection codes. In the third step, the original data message is created by combining the original payload and the original error detection code. In an ATM OAM cell, the original error detection code is inserted into the EDC field 160, overwriting the zeros previously in the field. The originating end point 220 may then transmit the original data message.

After the method begins (step 405), the original data message is received at the loopback end point 220 (step 410). After the original data message has been received by the device 300, the device 300 extracts the original payload from the original data message (step 415). With the original payload available to the device 300, the device obtains a modified payload from the original payload. The modified payload may be computed using a payload transformation formula. In mathematical terms, it can be said that the modified payload is determined according to the equation $P_M=F_2(P_o)$, where $P_M$ is the modified payload and $F_2(\ )$ is a payload transformation formula. The payload transformation formula may comprise, for example, changing the value of one or more bits of the original payload. In the case of an ATM OAM loopback cell, the transformation formula comprises resetting the loopback bit of the loopback indication field 141. In fact, the act of changing a bit in the message corresponds (mathematically) to adding a fixed polynomial to the received message polynomial. Thus, $P_M=F_2(P_o)=P_o+P_{FIXED}$, where $P_{FIXED}$ is a fixed polynomial consisting of terms where the bits change. Since the polynomial arithmetic is modulo-2, addition of two polynomials is equivalent to XORing of their corresponding binary representation. In addition, the effect of changing a bit from 1 to 0 or vice versa is the same polynomial addition.

Next, the device 300 extracts the original error detection code from the original data message (step 425). A modified error detection code is then obtained from the original error detection code using a modification formula (step 430). In mathematical terms, it can be said that the modified error detection code $C_M=F_3(C_o)$. The modification formula is different from the error detection formula, so $F_3(x) \neq F_1(x)$, but $F_3(C_o)=F_1(P_M)$. Computing the modification formula will involve fewer steps than computing the original error detection code or referring to a look-up table. Thus, the time needed to process a data message according to the invention can be much less than the typical method.

Use of the modification formula is an important difference from typical methods, and permits faster re-computation of the error detection code than using the error detection formula. The modification formula is derived from the predictability of the error detection formula and the payload transformation formula. The modified error detection code is obtained from the modification formula without use of the original payload or the modified payload. Thus, $P_M$ and $P_o$ are not variables in $F_3(\ )$. Where the payload transformation formula involves the changing of predetermined bits of the original payload, the modification formula may comprise XORing the original error detecting code with a predefined modification value. Recall that $P_M=F_2(P_o)=P_o+P_{FIXED}$. The value of interest is the CRC-10 of the transformed message $CRC(P_M)=F_1(P_M)=F_1(P_o+P_{FIXED})$. Here, an important property of polynomials over a field can be exploited, i.e., the operation of computing remainders (i.e., $F_1$) is distributive over addition, thus $CRC(P_M)=F_1(P_M)=F_1(P_o+P_{FIXED})=F_1(P_o)+F_1(P_{FIXED})=C_o+C_{FIXED}$. In the case of the ATM OAM loopback function, the modification formula comprises XORing the original error detection code with the binary representation of $C_{FIXED}$ value 0×2F9.

In another difference from typical methods, checking the integrity of the original payload is optional. By omitting the step of testing the integrity of the payload, considerable processing time may be eliminated. Although some degree of error detection is lost from this omission, in practice it has little impact, especially in loopback situations. In practice, after a data message has been looped back, it will typically be examined by a subsequent recipient such as the originating end point 210. The subsequent recipient will perform a normal error check of data message. Normally, the purpose of this error check is to determine if any errors arose after the data message was looped back. However, if the integrity of the payload is not tested at the loopback end point 220, the integrity check by the subsequent receipient will show whether errors arose at any time after the data message was originally transmitted, not only after it was looped back.

After the payload and the error detection code have been modified, a modified data message is formed from the modified payload and the modified error detection code (step 435). Finally, the modified data message may be transmitted (step 440) and the method ends (step 495).

It will be recognized that the particular order and separation of some steps may be changed without altering the results of the method. For example, step 425 may be combined with step 415. As another example, step 415 may precede step 425.

It can be seen that loopback-type functions are well suited to the present invention, because they typically involve the change of just a few bits (or even just one bit) in the original data message. However, the present invention may also be used with any data packet or codeword where the error correction/detection is pre-calculated in one step and then a subsequent step requires optional modification of a portion of the original data (potentially in software). An example of this would be a packet router where parts of the message (potentially the source or destination headers) are changed to other known values using a table. If the headers are in known or a set of standard bit positions, the change to the CRC32 value can be pre-calculated, removing the need to calculate the CRC32 over the whole message. Another case involves the Reed-Solomon engines on silicon that calculate a codeword for a given DSL frame. Subsequent changes to the DSL frame data for purposes such as Channelized Voice over DSL would require the recalculation of the codeword bits. As before, Reed-Solomon code words can be modified directly if known bit positions in the original message are changed. It is necessary only to XOR the current CRC value with a value, precalculated for a given set of bit changes in the message, to obtain the new CRC value.

Although exemplary embodiments of the present invention have been shown and described, it will be apparent to those having ordinary skill in the art that a number of changes, modifications, or alterations to the invention as described herein may be made, none of which depart from the spirit of the present invention. All such changes, modifications and alterations should therefore be seen as within the scope of the present invention.

It is claimed:

1. A data transmission method including a cyclic redundancy check that uses efficient re-computation of an original error detection code in an original data message, the original data message further comprising an original payload, the original error detection code comprising a value determined according to an error detection formula using the original payload, the error detection formula having a first number of steps, the method comprising:
   receiving the original data message,
   obtaining a modified payload from the original payload using a payload transformation formula,
   obtaining a modified error detection code from the original error detection code using a modification formula having a second number of steps,
   forming a modified data message from the modified payload and the modified error detection code, and
   transmitting said modified data message, wherein the modification formula is different from the error detection formula and permits faster recomputation of the error detection code than using the error detection formula, and the modified error detection code is obtained from the modification formula without use of the original payload or the modified payload.

2. The method of claim 1, wherein said original data message comprises an asynchronous transfer mode (ATM) operations and management (OAM) loopback cell.

3. The method of claim 2, wherein:
   the error detection formula comprises a CRC-10,
   the original payload includes a loopback indication bit with a value of 1,
   the step of obtaining the modified payload comprises resetting the loopback indication bit to a value of zero, and
   the step of obtaining the modified error detection code comprises XORing the original error detection code with 0x2F9.

4. The method of claim 1, wherein:
   the error detection formula comprises a cyclic redundancy check,
   the payload transformation formula used in the step of obtaining the modified payload comprises changing the value of one or more bits of the original payload, and
   the modification formula used in the step of obtaining the modified error detection code comprises XORing the original error detection code with a predefined modification value.

5. The method of claim 1, wherein the original data message comprises a loopback message, the method further comprising the steps of:
   creating the original payload,
   obtaining the original error detection code from the error detection formula using the original payload, and
   creating the original data message by combining the original payload and the original error detection code.

6. The method of claim 5, wherein the original error detection code is obtained by computing the error detection formula.

7. The method of claim 5, wherein the original error detection code is obtained from a look-up table using the original payload.

8. The method of claim 1, wherein the first number of steps is greater than the second number of steps.

9. A cyclic redundancy check device with efficient re-computation of an original error detection code in an original data message, the original data message further comprising an original payload, the original error detection code comprising a value determined according to an error detection formula using the original payload, the error detection formula having a first number of steps, the device comprising:
- a processor,
- a memory having a computer program comprising machine readable instructions for causing the processor to:
  - receive the original data message,
    - obtain a modified payload from the original payload using a payload transformation formula,
    - obtain a modified error detection code from the original error detection code using a modification formula having a second number of steps, and
    - form a modified data message from the modified payload and the modified error detection code,
  - wherein the modification formula is different from the error detection formula, and the modified error detection code is obtained from the modification formula without use of the original payload or the modified payload.

10. The device of claim 9, wherein said original data message comprises an asynchronous transfer mode (ATM) operations and management (OAM) loopback cell.

11. The device of claim 10, wherein:
the error detection formula comprises a CRC-10,
the original payload includes a loopback indication bit with a value of 1,
the instructions for causing the processor to obtain the modified payload comprise instructions for causing the processor to reset the loopback indication bit to a value of zero, and
the instructions for causing the processor to obtain the modified error detection code comprise instructions for causing the processor to XOR the original error detection code with 0x2F9.

12. The device of claim 9, wherein:
the error detection formula comprises a cyclic redundancy check,
the payload transformation formula comprises changing the value of one or more bits of the original payload, and
the modification formula comprises XORing the original error detecting code with a predefined modification value.

13. The device of claim 9, wherein the original data message comprises a loopback message, the memory further having instructions for causing the processor to:
create the original payload,
obtain the original error detection code from the error detection formula using the original payload, and
create the original data message by combining the original payload and the original error detection code.

14. The device of claim 13, wherein the instructions for causing the processor to obtain the original error detection code comprise instructions for causing the processor to compute the error detection formula.

15. The device of claim 13, wherein the instructions for causing the processor to obtain the original error detection code comprise instructions for causing the processor to obtain the original error detection code from a look-up table using the original payload.

16. The device of claim 9, consisting of a semiconductor chip.

17. The device of claim 9, comprising a bridge for a data network.

18. The device of claim 9, wherein the first number of steps is greater than the second number of steps.

19. A computer program stored on a computer-readable medium for efficient re-computation of an original error detection code in an original data message, the original data message further comprising an original payload, the original error detection code comprising a value determined according to an error detection formula using the original payload, the error detection formula having a first number of steps, the computer program comprising machine readable instructions for causing a processor to:
receive the original data message,
obtain a modified payload from the original payload using a payload transformation formula,
obtain a modified error detection code from the original error detection code using a modification formula having a second number of steps,
form a modified data message from the modified payload and the modified error detection code, and
transmit the modified data message,
wherein the modification formula is different from the error detection formula, and the modified error detection code is obtained from the modification formula without use of the original payload or the modified payload.

20. The computer program of claim 19, wherein said original data message comprises an asynchronous transfer mode (ATM) operations and management (OAM) loopback cell.

21. The computer program of claim 20, wherein:
the error detection formula comprises a CRC-10,
the original payload includes a loopback indication bit with a value of 1,
the instructions for causing the processor to obtain the modified payload comprise instructions for causing the processor to reset the loopback indication bit to a value of zero, and
the instructions for causing the processor to obtain the modified error detection code comprise instructions for causing the processor to XOR the original error detection code with 0x2F9.

22. The computer program of claim 19, wherein:
the error detection formula comprises a cyclic redundancy check,
the payload transformation formula comprises changing the value of one or more bits of the original payload, and
the modification formula comprises XORing the original error detecting code with a predefined modification value.

23. The computer program of claim 19, wherein the original data message comprises a loopback message, the memory further having instructions the instructions for causing the processor to:
create the original payload,
obtain the original error detection code from the error detection formula using the original payload, and
create the original data message by combining the original payload and the original error detection code.

24. The computer program of claim 23, wherein the instructions for causing the processor to obtain the original error detection code comprise instructions for causing the processor to compute the error detection formula.

25. The computer program of claim 23, wherein the instructions for causing the processor to obtain the original error detection code comprise instructions for causing the processor to obtain the original error detection code from a look-up table using the original payload.

26. The computer program of claim 19, wherein the first number of steps is greater than the second number of steps.

27. A method of modifying and transmitting an original data message which includes an original payload and an original error detection code, the original error detection code comprising a value indicative of a change in the original payload, the original error detection code being determined according to the equation $C_o=F_1(P_o)$, wherein $C_o$ is the original error detection code, $F_1(\ )$ is an error detection formula and $P_o$ is the original payload, the method comprising, after obtaining a modified payload, the modified payload being determined according to the equation $P_M=F_2(P_o)$, wherein $P_M$ is the modified payload and $F_2(\ )$ is a payload transformation formula:

providing a modification formula $F_3(\ )$,
computing a modified error detection code $C_M=F_3(C_0)$ at a faster rate than by using the error detection formula,
forming a modified data message from the modified payload and the modified error detection code, and
transmitting said modified data message,
wherein the result of $F_3(C_o)$ is the same as the result of $F_1(P_M)$, and $P_M$ and $P_o$ are not variables in $F_3(\ )$.

28. The method of claim 27, wherein:
the error detection formula $F_1(\ )$ comprises a CRC-10,
the original payload includes a loopback indication bit with a value of 1,
$F_2(P_o)$ comprises resetting the loopback indication bit to a value of zero, and $$F_3(C_o)=C_o \text{ XOR } 0x2F9.$$

29. The method of claim 27, wherein:
the error detection formula $F_1(\ )$ comprises a cyclic redundancy check,
$F_2(P_o)$ comprises changing the value of one or more bits of the original payload, and
the modification formula $F_3(C_o)$ comprises XORing the original error detecting code with a predefined modification value.

30. A device for modifying an original error detection code, the original error detection code comprising a value indicative of a change in an original payload, the original error detection code being determined according to the equation $C_o=F_1(P_o)$, wherein $C_o$ is the original error detection code, $F_1(\ )$ is an error detection formula and $P_o$ is the original payload, comprising:

a processor,
a memory having a computer program comprising machine readable instructions causing the processor to:
obtain a modified payload, the modified payload being determined according to the equation $P_M=F_2(P_o)$, wherein $P_M$ is the modified payload and $F_2(\ )$ is a payload transformation formula,
obtain a modification formula $F_3(\ )$, and
compute a modified error detection code $C_M=F_3(C_o)$, wherein the result of $F_3(C_o)$ is the same as the result of $F_1(P_M)$, and $P_M$ and $P_o$ are not variables in $F_3(\ )$.

31. The device of claim 30, wherein:
the error detection formula $F_1(\ )$ comprises a CRC-10,
the original payload includes a loopback indication bit with a value of 1,
$F_2(P_o)$ comprises resetting the loopback indication bit to a value of zero, and $$F_3(C_o)=C_o \text{XOR } 0x2F9.$$

32. The device of claim 31, wherein:
the error detection formula $F_1(\ )$ comprises a cyclic redundancy check,
$F_2(P_o)$ comprises changing the value of one or more bits of the original payload, and
the modification formula $F_3(P_o)$ comprises XORing the original error detecting code with a predefined modification value.

33. A data transmission method including a cyclic redundancy check (CRC) for efficient re-computation, in a loopback protocol, of an original error detection code in an original CRC data message polynomial $P_o$, $P_o$ comprising an original payload along with said original error detection code, the original error detection code comprising the remainder of dividing $P_o$ by a generator polynomial, comprising:

receiving the original data message,
obtaining a modified payload from the original payload by changing the bit values for a predetermined set of one or more bit locations in the original payload, independent of the length of the payload,
obtaining a modified error detection code from the original error detection code using a modification formula which is independent of the generator polynomial and permits faster recomputation of the error detection code than using the error detection formula,
forming a modified data message from the modified payload and modified error detection formula, and
transmitting said modified data message.

34. The method of claim 33, wherein said original data message comprises an asynchronous transfer mode (ATM) operations and management (OAM) loopback cell.

35. The method of claim 34, wherein:
the original payload includes a loopback indication bit with a value of 1,
the step of obtaining the modified payload comprises resetting the loopback indication bit to a value of zero, and
the step of obtaining the modified error detection code comprises XORing the original error detection code with 0x2F9.

36. The method of claim 33, wherein:
the modification formula used in the step of obtaining the modified error detection code comprises XORing the original error detection code with a predetermined modification value.

37. The method of claim 33, wherein the original data message comprises a loopback message, the method further comprising the steps of:
creating the original payload,
obtaining the original error detection code from the error detection formula using the original payload, and
creating the original data message by combining the original payload and the original error detection code.

38. The method of claim 37, wherein the original error detection code is obtained by computing the error detection formula.

39. The method of claim 37, wherein the original error detection code is obtained from a look-up table using the original payload.

40. A cyclic redundancy check (CRC) device with efficient re-computation, in a loopback protocol, of an original error detection code in an original CRC data message polynomial $P_o$, $P_o$ comprising an original payload along with said original error detection code, the original error detection code comprising the remainder of dividing $P_o$ by a generator polynomial, comprising:

a processor, a memory having a computer program comprising machine readable instructions for causing the processor to:

receive the original data message, obtain a modified payload from the original payload by changing the bit values for a predetermined set of one or more bit locations in the original payload, independent of the length of the payload, obtain a modified error detection code from the original error detection code using a modification formula which is independent of the generator polynomial, and form a modified data message from the modified payload and modified error detection formula.

41. The device of claim 40, wherein said original data message comprises an asynchronous transfer mode (ATM) operations and management (OAM) loopback cell.

42. The device of claim 41, the original payload includes a loopback indication bit with a value of 1, the instructions for causing the processor to obtain the, modified payload comprise instructions for causing the processor to reset the loopback indication bit to a value of zero, and the instructions for causing the processor to obtain the modified error detection code comprise instructions for causing the processor to XOR the original error detection code with 0x2F9.

43. The device of claim 40, wherein:

the modification formula used in the step of obtaining the modified error detection code comprises XORing the original error detection code with a predetermined modification value.

44. The device of claim 40, wherein the original data message comprises a loopback message, the memory further having instructions for causing the processor to:

create the original payload, obtain the original error detection code from the error detection formula using the original payload, and create the original data message by combining the original payload and the original error detection code.

45. The device of claim 44, wherein the instructions for causing the processor to obtain the original error detection code comprise instructions for causing the processor to compute the error detection formula.

46. The device of claim 40, wherein the instructions for causing the processor to obtain the original error detection code comprise instructions for causing the processor to obtain the original error detection code from a look-up table using the original payload.

47. The device of claim 40, consisting of a semiconductor chip.

48. The device of claim 40, comprising a bridge for a data network.

* * * * *